(12) United States Patent
Sonderegger et al.

(10) Patent No.: US 6,982,481 B1
(45) Date of Patent: Jan. 3, 2006

(54) SYSTEM FOR DISSIPATING HEAT AND SHIELDING ELECTROMAGNETIC RADIATION PRODUCED BY AN ELECTRONIC DEVICE

(75) Inventors: Mark Sonderegger, Kanata (CA); Balwantrai Mistry, Nepean (CA)

(73) Assignee: Nortel Networks Limited, Ottawa (CA)

(*) Notice: Subject to any disclaimer, the term of this patent is extended or adjusted under 35 U.S.C. 154(b) by 78 days.

(21) Appl. No.: 10/681,875

(22) Filed: Oct. 8, 2003

(51) Int. Cl.
*H01L 23/34* (2006.01)

(52) U.S. Cl. .............. 257/713; 257/717; 257/659; 361/704

(58) Field of Classification Search .......... 257/713, 257/717, 659; 361/704
See application file for complete search history.

(56) References Cited

U.S. PATENT DOCUMENTS

| | | | | |
|---|---|---|---|---|
| 5,153,379 A | * | 10/1992 | Guzuk et al. | 174/35 R |
| 5,175,613 A | * | 12/1992 | Barker et al. | 257/713 |
| 5,371,404 A | * | 12/1994 | Juskey et al. | 257/659 |
| 5,909,057 A | * | 6/1999 | McCormick et al. | 257/704 |
| 6,538,319 B2 | * | 3/2003 | Terui | 257/704 |
| 6,747,350 B1 | * | 6/2004 | Lin et al. | 257/704 |

* cited by examiner

*Primary Examiner*—Luan Thai
(74) *Attorney, Agent, or Firm*—Guerin & Rodriguez, LLP; Michael A. Rodriguez

(57) ABSTRACT

Described is an apparatus for dissipating heat and shielding electromagnetic radiation from at least one electronic device on a printed circuit board. The apparatus includes a printed circuit board with a surface, at least one integrated circuit on the surface, and an electrically conductive region surrounding the at least one integrated circuit. The apparatus also includes an electrically conductive cover portion. The electrically conductive cover portion has a top surface and a bottom edge, and defines a cavity. The top surface has at least one heat-dissipating structure that extends from it. The bottom edge is in electrically conductive contact with the electrically conductive region of the printed circuit board. The cavity encloses the at least one integrated circuit on the surface of the printed circuit board to shield electromagnetic radiation. The at least one integrated circuit is in thermally conductive communication with the electrically conductive cover portion. Heat generated by the at least one integrated circuit is transferred to the electrically conductive cover portion from which the heat is dissipated by the at least one heat-dissipating structure.

19 Claims, 5 Drawing Sheets

SYSTEM FOR DISSIPATING HEAT AND SHIELDING ELECTROMAGNETIC RADIATION PRODUCED BY AN ELECTRONIC DEVICE

FIELD OF THE INVENTION

The invention relates generally to systems for electronic devices. More particularly, the invention relates to a system that dissipates heat and shields electromagnetic radiation for an electronic device on a printed circuit board.

BACKGROUND

Electronic devices that conduct electrical currents dissipate energy. Frequently a significant portion of this energy is dissipated in the form of joule heating. The increase in temperature caused by joule heating can have serious implications for the performance and reliability of electronic devices. The problems associated with joule heating are particularly acute for integrated circuits where the high density of components and small interconnect dimensions place tight tolerances on the allowable temperature range.

Electromagnetic interference (EMI) is also a problem that can affect the performance of electronic devices. EMI is electromagnetic radiation produced by one device that disrupts or adversely impacts the performance or operation of another device. Integrated circuits can be significant sources of EMI because of their high density of interconnects and components. The nearer an electronic device is to a source of EMI, the more likely the device can be negatively influenced.

Industry has produced various solutions for dealing with the aforementioned problems of heating and EMI. Some solutions address heat dissipation for electronic devices but do not account for EMI, whereas other solutions provide EMI shielding but do not adequately dissipate heat. There is a need for a system that can both dissipate heat and shield EMI for an electronic device.

SUMMARY

In one aspect, the invention features an apparatus that dissipates heat and shields electromagnetic radiation from at least one electronic device on a printed circuit board. The apparatus includes a printed circuit board with a surface, at least one integrated circuit on the surface, and an electrically conductive region surrounding the at least one integrated circuit. The apparatus also includes an electrically conductive cover portion. The electrically conductive cover portion has a top surface and a bottom edge, and defines a cavity. The top surface has at least one heat-dissipating structure that extends from it. The bottom edge is in electrically conductive contact with the electrically conductive region of the printed circuit board. The cavity encloses the at least one integrated circuit on the surface of the printed circuit board to shield electromagnetic radiation. The at least one integrated circuit is in thermally conductive communication with the electrically conductive cover portion. Heat generated by the at least one integrated circuit is transferred to the electrically conductive cover portion from which the heat is dissipated by the at least one heat-dissipating structure.

In another aspect, the invention features a printed circuit board. The printed circuit board includes a board surface having an electrically conductive region that surrounds the at least one integrated circuit, at least one integrated circuit on the board surface, and an electrically conductive cover portion. The electrically conductive cover portion has a top surface and a bottom edge, and defines a cavity. The top surface of the cover portion has at least one heat dissipating structure that extends from it. The bottom edge is in electrically conductive contact with the electrically conductive region on the board surface. The cavity encloses the at least one integrated circuit on the board surface to shield electromagnetic radiation. The at least one integrated circuit is in thermally conductive communication with the electrically conductive cover portion. Heat generated by the at least one integrated circuit is transferred to the electrically conductive cover portion from which the heat is dissipated by the at least one heat-dissipating structure.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

The present invention features an integrated system that both dissipates heat and shields electromagnetic interference (EMI) produced by at least one electronic device placed on a printed circuit board (PCB). An EMI-shielding cover, a conductive region on the PCB, and at least one ground plane of the PCB cooperate to almost completely enclose the at least one electronic device in an electrically conductive grounded housing. To improve EMI protection, the EMI-shielding cover is placed in close proximity to the electronic device. Thermally conductive contact is established between the cover and the electronic device. The same cover that provides EMI shielding also includes at least one heat-dissipating structure for dissipating heat transferred to the cover from the electronic device.

Figure 1A:
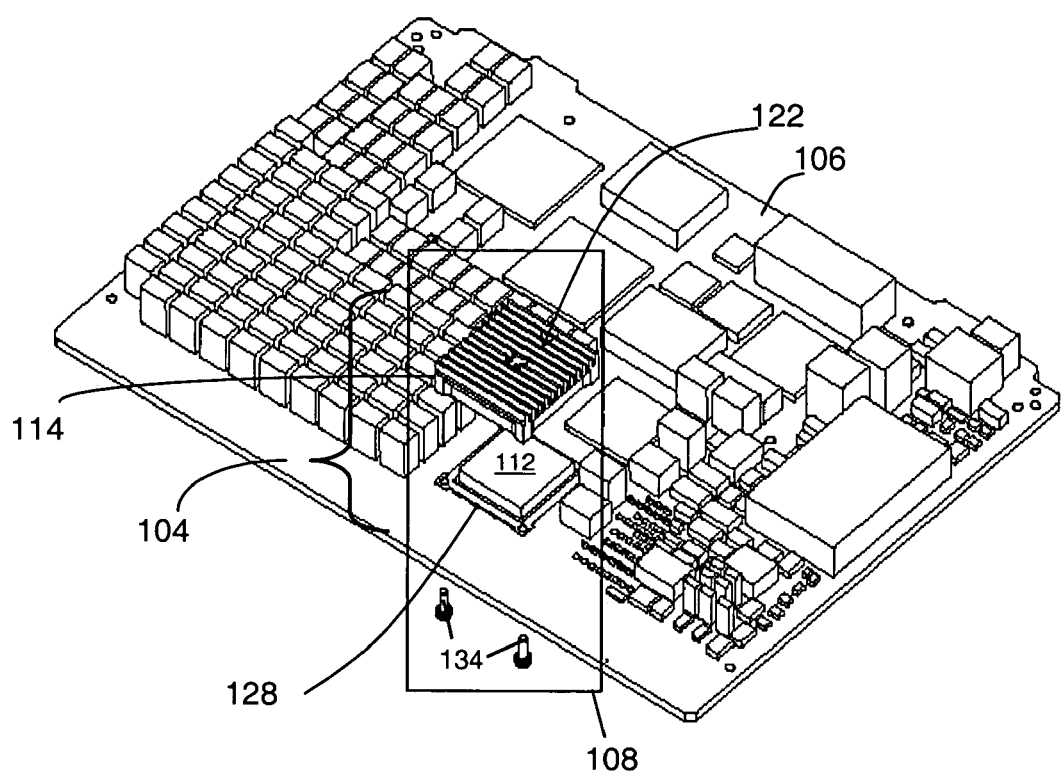
FIG. 1A is a perspective drawing of an embodiment of a EMI shield/heat-sink system on a printed circuit board constructed in accordance with the principles of the invention.
Figure 1B:
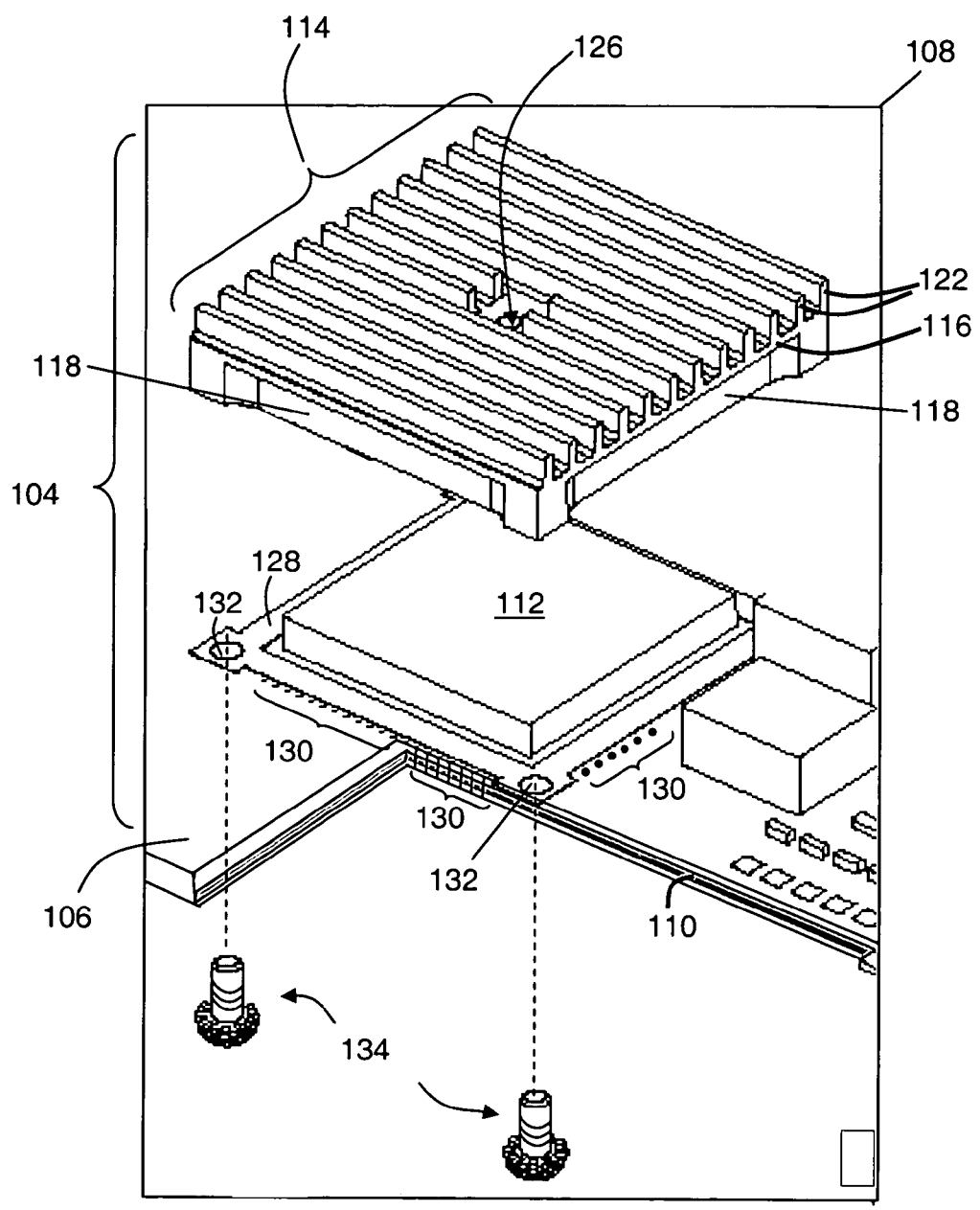
FIG. 1B is an enlarged view of the EMI shield/heat-sink system shown in the insert of FIG. 1A.

FIG. 1A and FIG. 1B show an embodiment of an electromagnetic interference (EMI) shield/heatsink system 104 integrated with a multi-layered printed circuit board (PCB) 106 in accordance with the principles of the invention. FIG. 1B corresponds to the insert 108 of FIG. 1A and includes a cut-away drawing of a portion of the PCB 106 to show various layers of the PCB 106. The PCB 106 includes at least one ground plane or conducting plane 110. Some of the electronic devices shown in the insert 108 in FIG. 1A are removed from FIG. 1B to more clearly illustrate the invention. The PCB 106 also includes an electronic device 112, here an integrated circuit. Other types of electronic devices on the PCB 106 include, but are not limited to, transistors, capacitors, resistors, and other integrated circuits.

The EMI shield/heat-sink system 104 includes a rectangular, electrically conductive cover portion 114 with a top portion 116 and a plurality of sidewalls 118 extending from the top portion 116. The top portion 116 and sidewalls 118 define a cavity 120 (see FIGS. 3A and 3B). Heat-dissipating structures 122, integral with the top portion 116, extend substantially perpendicularly therefrom. In one embodiment, the heat-dissipating structures 122 are a plurality of vertical fins. Other types of heat-dissipating structures can be used without departing from the principles of the invention. Centrally located in the top portion 116 is an opening 126 for receiving an injection of a malleable thermal epoxy. The thermal epoxy produces a thermally conductive path between the cover portion 114 and the integrated circuit 112.

The EMI shield/heatsink system 104 also includes an electrically conductive region 128 on a surface layer of the PCB 106. In the embodiment shown, the electrically conductive region 128 forms a rectangle that closely surrounds the integrated circuit 112 on the PCB 106.

At each corner of the electrically conductive region 128 is a circular opening 132 that extends entirely through the PCB 106. Pins 134 enter the openings 132 from the side of the PCB 106 opposite the integrated circuit 112 and securely connect to corresponding openings in the bottom edge of the electrically conductive cover portion 114. When the cover portion 114 is secured to the PCB 106, the bottom edge of the cover portion 114 makes electrically conductive contact with the electrically conductive region 128 surrounding the integrated circuit 112. Thus, the electrically conductive cover portion 114, the electrically conductive region 128 of the PCB 106, the through-holes 130, and the at least one ground plane 110 are in electrical communication with each other. Together, these various features almost entirely enclose the integrated circuit 112. The electrically conductive cover portion 114 provides shielding above and at the sides of the integrated circuit 112, electrically conductive region 128 and the closely arranged through-holes 130 provide some degree of side shielding, and the at least one ground plane 110 provides shielding below the integrated circuit 112. With the ground plane 110, the surrounding enclosure produced by the various shielding features is electrically grounded. The close proximity between the electrically conductive region 128 and the integrated circuit 112 improves the effectiveness of the EMI shield/heatsink system 104 to shield electromagnetic radiation. In addition to shielding external devices (i.e., external to the EMI shield/heat-sink system 104) from EMI generated by the integrated circuit 112, the EMI shield/heatsink system 104 also shields the integrated circuit 112 from EMI generated by the external electronic devices on the PCB 106.

Figures 2A, 2B:
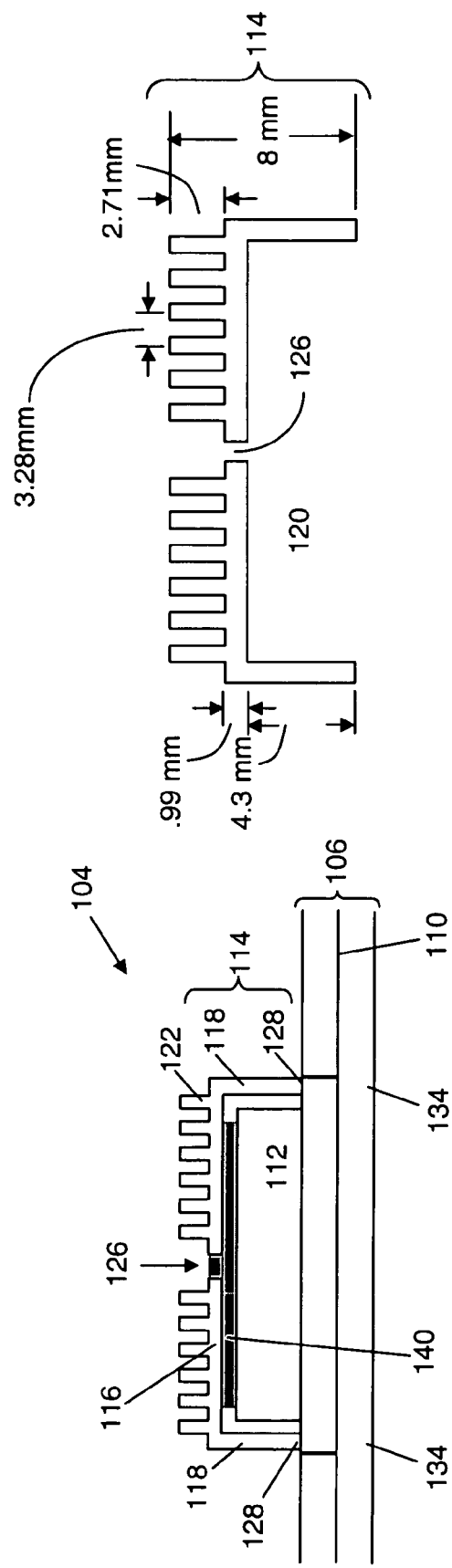
FIG. 2A is a cross-sectional view of the EMI shield/heat-sink system.
FIG. 2B is a cross-sectional view of a cover portion of the EMI shield/heat-sink system.

FIG. 2A shows a cross-sectional view of the EMI shield/heat-sink system 104 of FIG. 1B along a plane perpendicular to the heat-dissipating structures 122. In this view, the cover portion 114 is secured to the electrically conductive region 128 on the PCB 106 to enclose the integrated circuit 112. A thermally conductive compound 140, inserted through the opening 126, fills a gap between the integrated circuit 112 and a lower surface of the top portion 116 to produce thermal communication therebetween. The thermally conductive compound 140 transfers heat generated by the integrated circuit 112 to the top portion 116 and fins 122 for thermal cooling by convection.

FIG. 2B shows an exemplary set of dimensions for features of the electrically conductive cover portion 114. The height of the electrically conductive cover portion 114, measured from the bottom edge to the top of the heat-dissipating structure 122, is approximately 8 mm. A thickness of the top portion 116 is approximately 0.99 mm, and the sidewalls 118 have an approximate height of 4.3 mm. The heat-dissipating structures 122 have an approximate height of 2.71 mm, and a separation distance measured from the center of one fin to the center of an adjacent fin is approximately 3.28 mm.

Figure 3B:
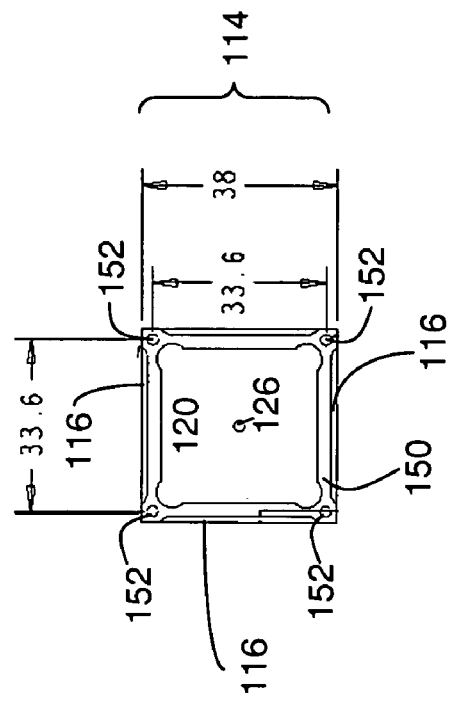
FIG. 3B is a bottom view of the cover portion of the EMI shield/heat-sink system.
Figure 3A:
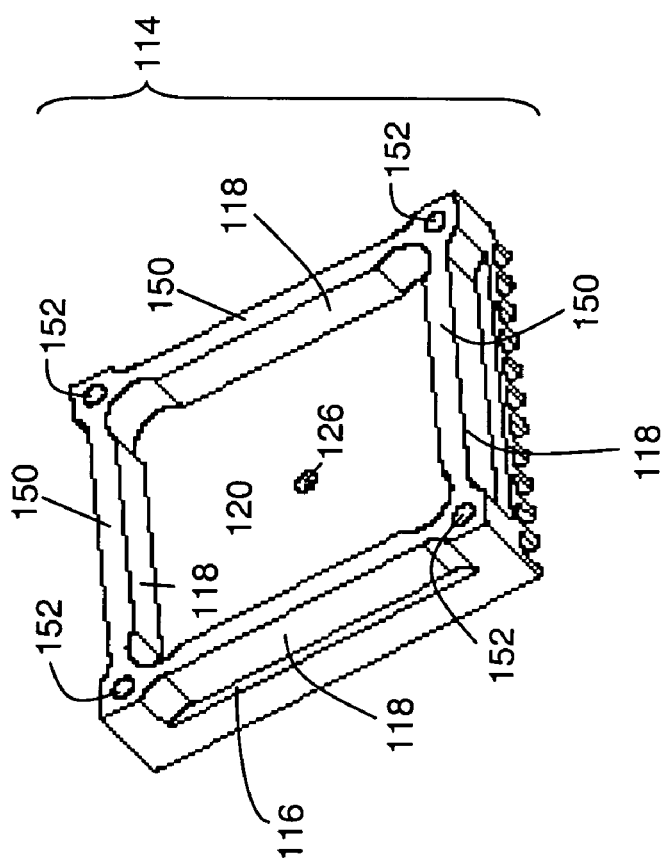
FIG. 3A is a perspective view of a bottom of the cover portion of the EMI shield/heat-sink system.

FIG. 3A and FIG. 3B show a perspective view and a bottom view, respectively, of the underside of the cover portion 114. The cover portion 114 includes the top portion 116 and the four sidewalls 118 that define the cavity 120. The sidewalls 118 extend from the top portion 116. The bottom edge 150 of the sidewalls 118 includes a plurality of openings 152 that correspond to the openings 132 on the PCB 106. In one embodiment, the openings 152 are threaded for securely receiving the screw pins 134. FIG. 3B specifies exemplary dimensions such as the approximate width of the cover portion 114 (here, 38 mm) and the approximate distance between neighboring openings 152 (here, 33.6 mm).

Figure 4B:
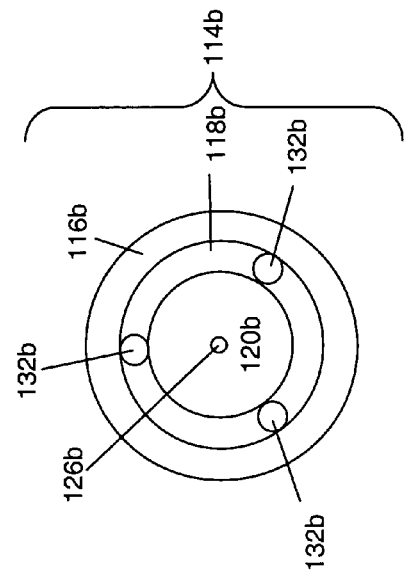
FIG. 4B is a bottom view of a curved cover portion of another embodiment of an EMI shield/heat-sink system of the invention.
Figure 4A:
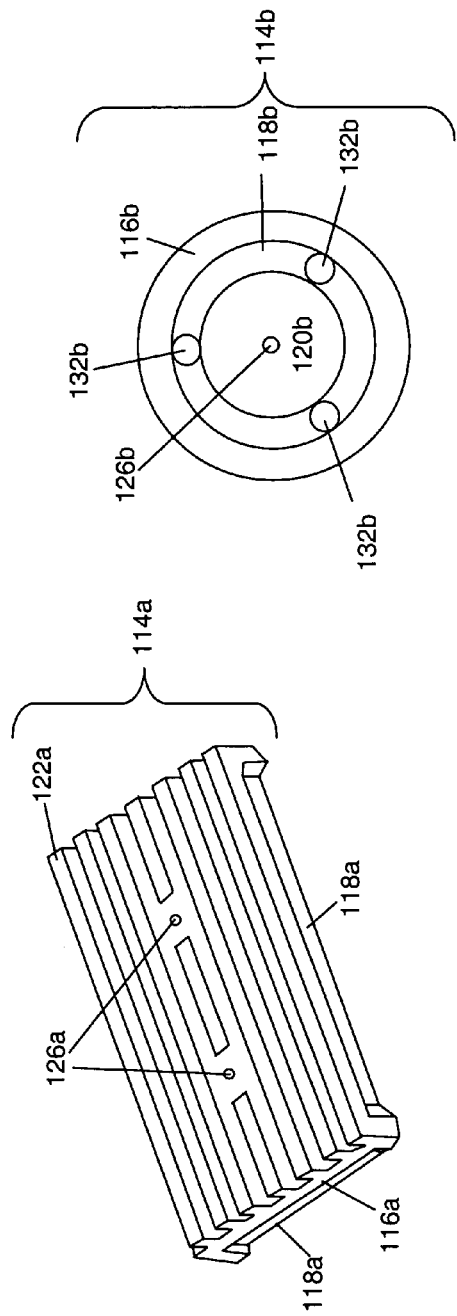
FIG. 4A is a perspective drawing of a rectangular cover portion of another embodiment of an EMI shield/heat-sink system of the invention.

FIGS. 4A, 4B, 4C, and 4D show alternative embodiments of electrically conductive cover portions 114a, 114b, 114c and 114d, respectively. FIG. 4A shows a perspective view of a rectangular electrically conductive cover portion 114a. The electrically conductive cover portion 114a has sidewalls 118a, heat-dissipating structures 122a, a top portion 116a, and a plurality of openings 126a. FIG. 4B shows a bottom view of a circular electrically conductive cover portion 114b having a curved sidewall 118b, a curved top portion 116b, and an opening 126b. The top portion 116b and sidewall 118b define a cavity 120b. A bottom edge of the sidewall 118b has three openings 132b for receiving corresponding pins that secure the cover portion 114b to a PCB.

Figure 4D:
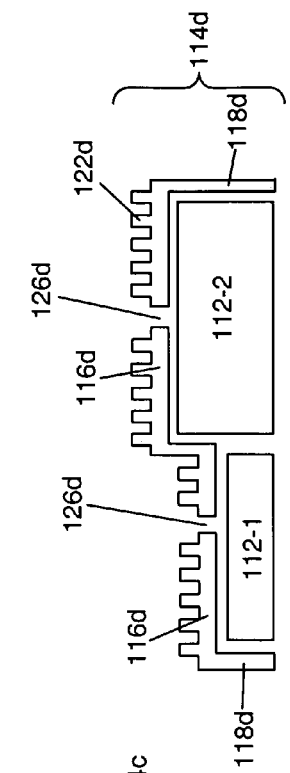
FIG. 4D is a cross-sectional view of a cover portion for enclosing multiple electronic devices in another embodiment of an EMI shield/heat-sink system of the invention.
Figure 4C:
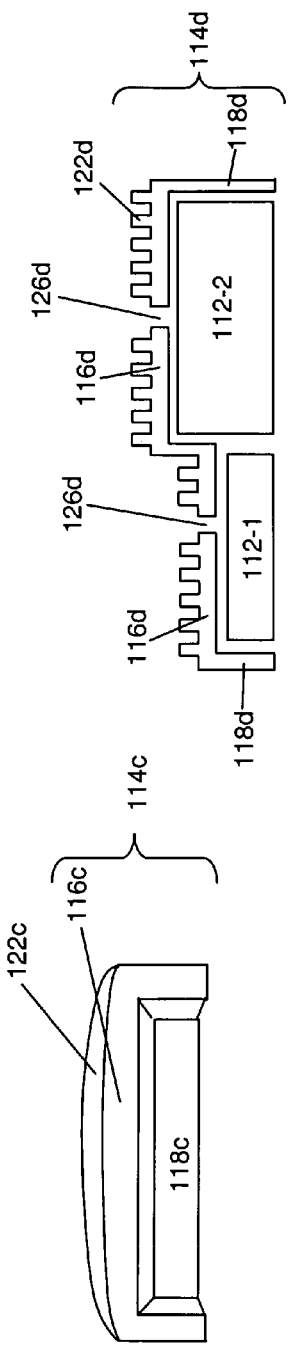
FIG. 4C is a side view of a domed cover portion of another embodiment of an EMI shield/heat-sink system of the invention.

FIG. 4C shows a side view of an electrically conductive cover portion 114c that has a domed top portion 116c, a sidewall 118c, and heat-dissipating structures 122c shaped according to the curvature of the domed top portion 116c. FIG. 4D shows a cross-sectional view of an electrically conductive cover portion 114d that encloses two integrated circuits 112-1 and 112-2. The electrically conductive cover portion 114d has heat-dissipating structures 122d, sidewalls 118d, two openings 126d and a top portion 116d. The height of the sidewalls 118d and the shape of the top portion 116d vary to accommodate the different heights of enclosed integrated circuits 112-1 and 112-2. Each of the above-described cover-portion embodiments aligns with and makes electrical contact with an appropriately shaped electrically conductive region on a PCB.

While the invention has been shown and described with reference to specific preferred embodiments, it should be understood by those skilled in the art that various changes in form and detail may be made therein without departing from the spirit and scope of the invention as defined by the following claims. For example, the dimensions and shapes of the cover portions 114 discussed above are illustrative only. Other dimensions and shapes are contemplated in accordance with the invention to accommodate the varying dimensions of enclosed devices and to accommodate the space and geometry constraints imposed by placing devices in close proximity on a PCB.

What is claimed is:

1. An apparatus for dissipating heat and shielding electromagnetic radiation from at least one integrated circuit on a printed circuit board, the apparatus comprising:
   a printed circuit board comprising a plurality of layers including an inner conducting layer and an exterior layer having a surface with at least one integrated circuit disposed thereon and an electrically conductive region surrounding the at least one integrated circuit, the printed circuit board having a row of electrically conductive through-holes located adjacent to and along one side of the electrically conductive region, the electrically conductive through-holes being in electrical communication with the electrically conductive region and with the conducting layer; and
   an electrically conductive cover portion having a top surface and a bottom edge, the top surface having at least one heat-dissipating structure extending therefrom and the bottom edge being in electrically conductive contact with the electrically conductive region of the printed circuit board, the electrically conductive cover portion defining a cavity that encloses the at least one integrated circuit on the surface of the printed circuit board to shield electromagnetic radiation, the at least one integrated circuit being in thermally conductive communication with the electrically conductive cover portion for transferring heat thereto to be dissipated by the at least one heat-dissipating structure.

2. The apparatus of claim 1 wherein the electrically conductive cover portion is rectangular in shape.

3. The apparatus of claim 1 wherein the electrically conductive cover portion is circular in shape.

4. The apparatus of claim 1 wherein the top of the at least one heat-dissipating structure is flat.

5. The apparatus of claim 1 wherein the top of the at least one heat-dissipating is curved.

6. The apparatus of claim 1 wherein the cavity of the electrically conductive cover portion is sized to cover the at least one integrated circuit to within a specified separation distance between a top surface of the at least one integrated circuit and a lower surface of the electrically conductive cover portion.

7. The apparatus of claim 1, further comprising a thermally conductive compound disposed in the cavity of the electrically conductive cover portion to produce thermally conductive communication between the at least one integrated circuit and the electrically conductive cover portion.

8. The apparatus of claim 1, wherein the electrically conductive cover portion includes a hole to insert a malleable thermally conductive compound into the cavity of the electrically conductive cover portion.

9. The apparatus of claim 1, wherein the at least one heat-dissipating structure is an integral part of the electrically conductive cover portion.

10. The apparatus of claim 1, wherein the cavity of the electrically conductive cover portion encloses two or more integrated circuits.

11. The apparatus of claim 1, wherein the electrically conductive region forms a plurality of corners, the side along which the row of through-holes is located extends inwardly from the corners toward the at least one integrated circuit, and the row of electrically conductive through-holes is located in an indented region formed between adjacent corners by the side.

12. A printed circuit board, comprising:
    a plurality of layers including an inner conducting layer and an exterior layer having a board surface having an electrically conductive region formed thereon that surrounds an area of the board surface;
    a row of electrically conductive through-holes located adjacent to and alone one side of the electrically conductive region, the electrically conductive through-holes being in electrical communication with the electrically conductive region and with the inner conducting layer;
    at least one integrated circuit on the board surface within the surrounded area; and
    an electrically conductive cover portion having a top surface and a bottom edge, the top surface having at least one heat-dissipating structure extending therefrom, the bottom edge being in electrically conductive contact with the electrically conductive region that surrounds the area with the at least one integrated circuit, the electrically conductive cover portion defining a cavity that encloses the at least one 18 integrated circuit on the board surface to shield electromagnetic radiation, the at least one integrated circuit being in thermally conductive communication with the electrically conductive cover portion for transferring heat thereto to be dissipated by the at least one heat-dissipating structure.

13. The printed circuit board of claim 12, wherein the electrically conductive cover portion is rectangular in shape.

14. The printed circuit board of claim 12, wherein the cavity of the electrically conductive cover portion is sized to cover the at least one integrated circuit to within a specified separation distance between a top surface of the at least one integrated circuit and a lower surface of the electrically conductive cover portion.

15. The printed circuit board of claim 12, further comprising a thermally conductive compound disposed in the cavity of the electrically conductive cover portion to produce thermally conductive communication between the at least one integrated circuit and the electrically conductive cover portion.

16. The printed circuit board of claim 12, wherein the electrically conductive cover portion includes a hole to insert a malleable thermally conductive compound into the cavity of the electrically conductive cover portion.

17. The printed circuit board of claim 12, wherein the at least one heat-dissipating structure is an integral part of the electrically conductive cover portion.

18. The printed circuit board of claim 12, wherein the cavity of the electrically conductive cover portion encloses two or more integrated circuits.

19. The printed circuit board of claim 12, wherein the electrically conductive region forms a plurality of corners, the side along which the row of through-holes is located extends inwardly from the corners toward the at least one integrated circuit, and the row of electrically conductive through-holes is located in an indented region formed between adjacent corners by the side.

* * * * *

UNITED STATES PATENT AND TRADEMARK OFFICE
CERTIFICATE OF CORRECTION

PATENT NO. : 6,982,481 B1  Page 1 of 1
DATED : January 3, 2006
INVENTOR(S) : Mark Sonderegger and Balwantrai Mistry It is certified that error appears in the above-identified patent and that said Letters Patent is hereby corrected as shown below:

<u>Column 6,</u>
Line 26, after "one" delete "18".

Signed and Sealed this

Twenty-third Day of May, 2006

JON W. DUDAS
*Director of the United States Patent and Trademark Office*